United States Patent
Cha et al.

(10) Patent No.: US 7,605,022 B2
(45) Date of Patent: Oct. 20, 2009

(54) METHODS OF MANUFACTURING A THREE-DIMENSIONAL SEMICONDUCTOR DEVICE AND SEMICONDUCTOR DEVICES FABRICATED THEREBY

(75) Inventors: Yong-Won Cha, Gyeonggi-do (KR); Dong-Chul Suh, Suwon (KR); Dae-Lok Bae, Gyeonggi-do (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 246 days.

(21) Appl. No.: 11/621,513

(22) Filed: Jan. 9, 2007

(65) Prior Publication Data

US 2007/0158831 A1    Jul. 12, 2007

(30) Foreign Application Priority Data

Jan. 10, 2006    (KR)    ............... 10-2006-0002839

(51) Int. Cl.
    *H01L 23/34*    (2006.01)
(52) U.S. Cl. ............... 438/122; 438/455; 257/E23.08
(58) Field of Classification Search ............... 438/106, 438/107, 597, 455, 122; 257/724, E23.08, 257/E23.083, E23.087, E23.088, E23.09, 257/E23.101
    See application file for complete search history.

(56) References Cited

U.S. PATENT DOCUMENTS

| | | | |
|---|---|---|---|
| 5,741,733 A | 4/1998 | Bertagnolli et al. | |
| 5,994,207 A | 11/1999 | Henley et al. | |
| 6,022,766 A | 2/2000 | Chen et al. | |
| 6,368,938 B1 * | 4/2002 | Usenko | 438/407 |
| 6,423,614 B1 | 7/2002 | Doyle | |
| 6,432,809 B1 * | 8/2002 | Tonti et al. | 438/618 |
| 6,596,610 B1 | 7/2003 | Kuwabara et al. | |
| 6,720,640 B2 | 4/2004 | Kuwabara et al. | |
| 6,833,587 B1 | 12/2004 | Lin | |
| 6,844,243 B1 | 1/2005 | Gonzalez | |
| 2002/0081823 A1 * | 6/2002 | Cheung et al. | 438/455 |
| 2003/0114001 A1 | 6/2003 | Jones et al. | |

FOREIGN PATENT DOCUMENTS

| | | |
|---|---|---|
| JP | 2004-103602 | 4/2004 |
| KR | 10-2005-0049101 | 5/2005 |
| KR | 10-2005-0060982 | 6/2005 |
| KR | 2005-0060982 | 6/2005 |

* cited by examiner

*Primary Examiner*—Matthew Smith
*Assistant Examiner*—Michele Fan
(74) *Attorney, Agent, or Firm*—Marger Johnson & McCollom, P.C.

(57) ABSTRACT

A method of fabricating a three-dimensional semiconductor device is provided along with a three-dimensional semiconductor device fabricated thereby. The method includes forming a heat conductive plug to channel heat away from devices on a substrate, while high temperature processes are performed on a stacked semiconductor layer. The ability to use high temperature processes on the stacked semiconductor layer without adversely effecting devices on the substrate allows the formation of a high quality single-crystalline stacked semiconductor layer. The high quality single-crystalline semiconductor layer can then be used to fabricate improved thin film transistors.

26 Claims, 7 Drawing Sheets

__US 7,605,022 B2__

METHODS OF MANUFACTURING A THREE-DIMENSIONAL SEMICONDUCTOR DEVICE AND SEMICONDUCTOR DEVICES FABRICATED THEREBY

This application claims priority from Korean Patent Application No. 2006-02839, filed on Jan. 10, 2006, which is herein incorporated by reference in its entirety.

BACKGROUND

1. Technical Field

This disclosure generally relates to the field of semiconductor devices. Specifically, the disclosure relates to three-dimensional semiconductor structures and methods of forming three-dimensional semiconductor devices.

2. Description of the Related Art

Semiconductor devices, such as semiconductor memories, are in widespread use in consumer electronics and other applications. Consumer demand for ever higher densities of semiconductor devices has motivated manufacturers to seek methods of decreasing the size of discrete devices that typically make up a semiconductor device. The discrete devices include transistors, capacitors and resistors. The discrete devices may be fabricated using various processes such as photolithography, wet and dry etching, thin film deposition, and diffusion. Unfortunately, limits on the photolithography process, such as the wavelength of the light used, cause there to be limits on the size of the discrete devices. Consequently, the photolithography process seems to place a limit on the density of semi-conductor devices that can be achieved.

One solution to this problem, three-dimensional semiconductor structures, has been proposed to increase integration density of semiconductor devices. One such example is disclosed in U.S. Pat. No. 6,022,766 to Chen, et al. ("Chen"), in which an ordinary bulk transistor is formed in a single crystal silicon substrate and a thin film transistor (TFT) is stacked over the bulk transistor. Specifically, an amorphous silicon layer is deposited over the substrate having the bulk transistor. Then, the resulting structure is heat treated to crystallize the amorphous silicon layer and thereby to form a body layer that is generally formed of a polycrystalline silicon ("polysilicon") material.

However, large grains in the polysilicon material can act as a carrier trap, thereby degrading the electrical characteristics of the TFT. In particular, the carrier mobility of a TFT fabricated in a polysilicon substrate is smaller than that of a bulk transistor fabricated in a single crystal silicon substrate. This decrease in carrier mobility is known to be largely due to carrier trapping in the grain boundaries of the polycrystalline material, e.g., polysilicon. As a result, the electrical characteristics of the resulting TFT are not as desirable as that of the bulk transistor.

One approach to improve the electrical characteristics of TFTs fabricated in semiconductor layers is to improve the crystalline quality of the layers by, for example, minimizing the grain boundaries incorporated into a single semiconductor device. This can be accomplished by high-temperature heat treatment or annealing of the layer, but these high temperature heat treatments can lead to degradation of the lower bulk devices. For example, the source/drain regions of the lower devices may suffer from undesirable dopant diffusion during the high temperature heat treatment step, leading to inconsistent device performance.

Another approach to forming a three-dimensional semiconductor device is disclosed in U.S. Pat. No. 6,423,614 to Doyle ("Doyle"). Doyle discloses ion implantation of hydrogen atoms on a first semiconductor substrate to form a semiconductor film separated from the bulk substrate by a damaged layer created by the hydrogen implantation. Then, a first oxidation layer is formed over the first semiconductor substrate. A second oxidation layer and a metal layer are then formed over a second semiconductor substrate. The metal layer on the second semiconductor substrate is bonded with the first oxidation layer of the first semiconductor substrate. The bulk substrate of the first substrate is delaminated from the second substrate while the first oxidation layer and the semiconductor film of the first substrate remain over the metal layer of the second substrate. The semiconductor film is planarized using a chemical mechanical polishing (CMP) process. A TFT is formed using the planarized semiconductor film as a body layer. The resulting structure having the TFT is annealed at a low temperature of about 400° C. in a hydrogen atmosphere, causing the second substrate having the metal layer and the second oxidation layer to be delaminated from the first oxidation layer of the first substrate. Then, a carrier wafer is placed onto the TFT and is delaminated from the TFT. Subsequently, the first oxidation layer and any remaining portion of the metal layer are removed. Then, the TFT is bonded with a third substrate having bulk transistors.

According to Doyle, three different delamination processes and at least three bonding processes are required to form the thin film transistor over the substrate having bulk transistors, i.e., two layers of transistors. Therefore, the process of Doyle comprises many processing steps, which complicates the overall semiconductor fabrication process.

Consequently, novel methods that can improve the electrical characteristics of thin film transistors fabricated on substrates containing bulk devices by, for example, limiting exposure of the lower bulk devices to high temperatures are desired. Further, there is a need for an improved process that includes a minimum number of processing steps, thereby simplifying the overall fabrication process.

SUMMARY

Embodiments of the invention provide a method for fabricating three-dimensional semiconductor devices using a single bonding process and a single delamination process. The method prevents degradation of lower discrete devices during high-temperature heat treatment of the body layer of thin film transistors.

In one embodiment, a semiconductor device comprises a semiconductor substrate having an active region defined by a field region; a lower discrete device disposed on the semiconductor substrate, the lower discrete device formed on the active region; an insulation layer disposed on the semiconductor substrate substantially covering the lower device; a semiconductor surface layer disposed on the insulation layer; an upper device formed on the semiconductor surface layer; and a heat conductive plug extending through the insulation layer, the heat conductive plug formed in a region of the semiconductor substrate other than the active region and the field region, the heat plug configured to conduct heat from the semiconductor surface layer primarily therethrough into the semiconductor substrate away from the lower device during heat treatment.

BRIEF DESCRIPTION OF THE DRAWINGS

The foregoing and other objects, features and advantages of the present invention will become more apparent by describing in detail exemplary embodiments thereof with reference to the attached drawings.

DETAILED DESCRIPTION OF EXAMPLE EMBODIMENTS

The invention will now be described more fully with reference to the accompanying drawings, in which exemplary embodiments are shown. The invention may, however, be embodied in many different forms and should not be construed as being limited to the embodiments set forth herein; rather, these embodiments are provided so that this disclosure is thorough and complete, and conveys the inventive principles found in embodiments of the invention to those skilled in the art.

Figure 1:
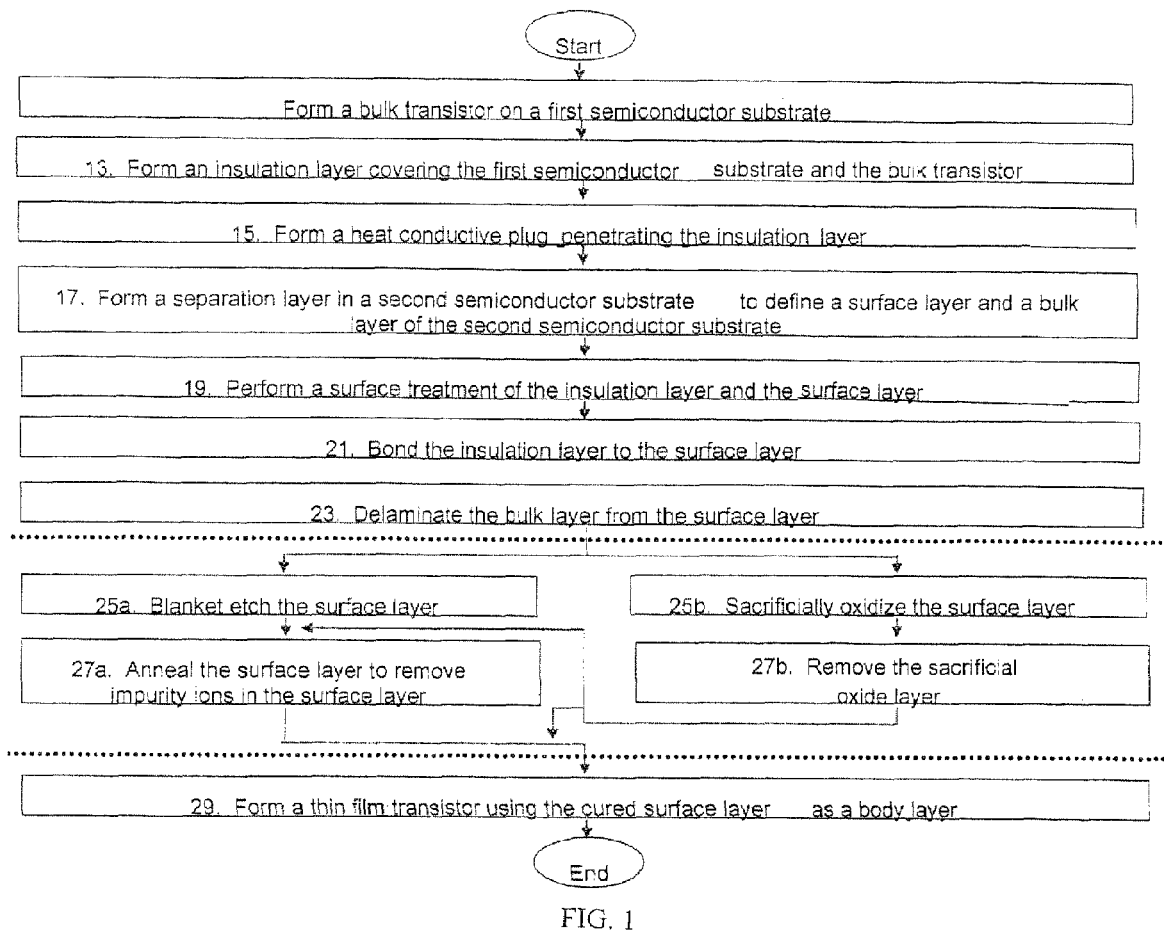
FIG. 1 is a process flow chart illustrating a method of fabricating a semiconductor device according to some embodiments.
Figure 2:
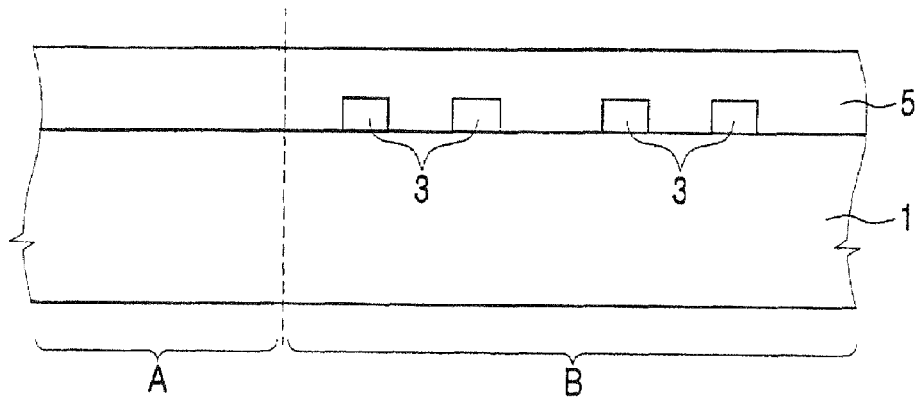
FIGS. 2-11 show consecutive steps for fabricating a three-dimensional semiconductor device using a heat conductive plug in accordance with an embodiment of the present invention.

FIG. 1 is a process flow chart illustrating a method of fabricating a semiconductor device according to some embodiments. FIG. 2 is a cross-sectional view of a first semiconductor substrate according to some embodiments.

Referring to FIGS. 1 and 2, lower discrete devices or lower devices 3, such as bulk transistors, are formed on the first semiconductor substrate 1. The bulk transistor may refer to a device built on a single-crystal bulk substrate. The first semiconductor substrate 1 may be a silicon substrate, a GaAs substrate, a Silicon-on-Insulator (SOI) substrate, or any other type of semiconductor substrate.

A lower discrete device 3 may be a planar transistor or a vertical transistor, i.e. a FinFET or tri-gate transistor. The lower discrete device 3 may also be any other passive or active device, e.g., a capacitor, resistor, diode and so on. The lower discrete device 3 may be formed using the first semiconductor substrate 1 as a body layer.

According to some embodiments, the lower discrete devices 3 may include a bulk transistor that is formed on the first semiconductor substrate 1 and a capacitor or resistor stacked on the bulk transistor.

An insulation layer 5 is then formed on the semiconductor substrate 1 having lower discrete devices 3 (step 13 of FIG. 1). The insulation layer 5 may substantially cover the lower discrete devices 3.

Referring to FIG. 2, the first semiconductor substrate 1 may include a first area A and a second area B. The second area B may correspond to an area in which an active or passive discrete device is formed. The second area B may include cell and peripheral regions (not illustrated) known to one skilled in the art. The first area A may be an area other than the second area B. For instance, the first area A may be a dummy region which does not include a discrete device, e.g., an active or passive device, and does not relate to the operation of the semiconductor device. A scribe line or scribe lane is an example of a dummy region, but it will be understood that dummy region as used herein broadly refers to a region that is absent discrete, e.g., active or passive, devices, i.e. a region in first area A that is laterally spaced apart therefrom by an amount that permits heat to be conducted through a conductive plug formed within such a dummy region without damaging or adversely affecting the nearest discrete device in second area B.

Figure 12A:
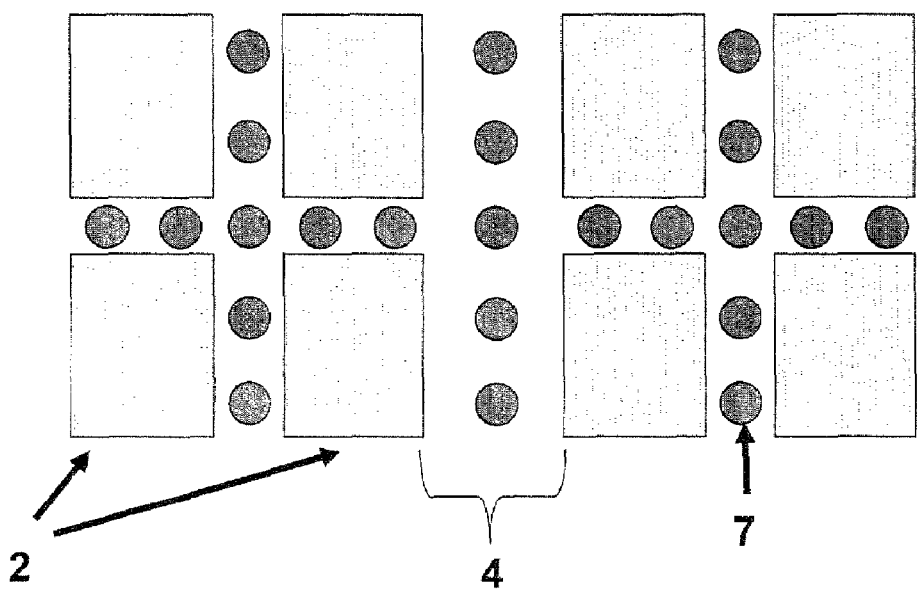
FIG. 12A is a schematic partial plan view of a semiconductor die, which illustrates a dummy region formed between cell blocks according to an embodiment of the present invention.
Figure 12B:
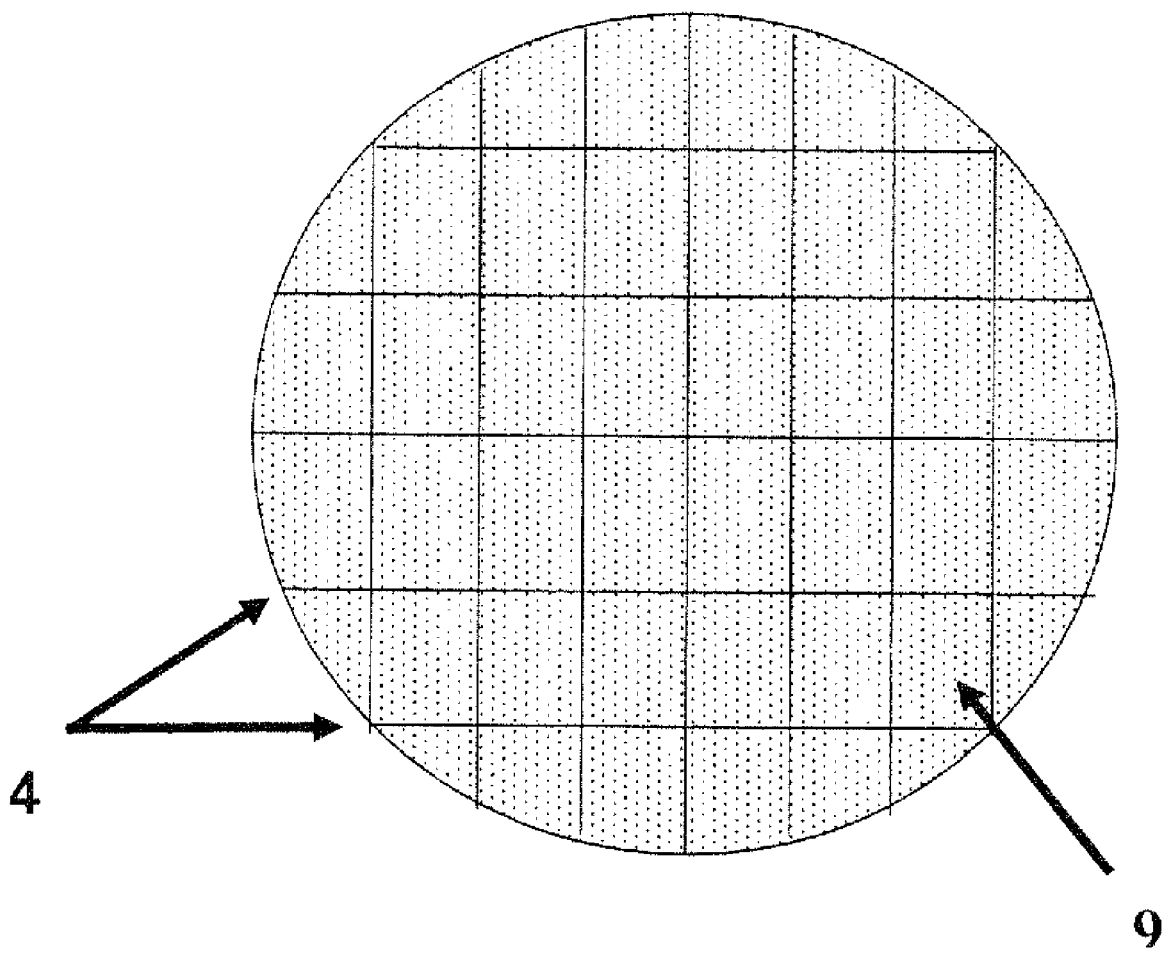
FIG. 12B is a schematic plan view of a wafer illustrating a plurality of semiconductor dies defined by plural scribe lines.

According to one aspect, the lower discrete devices 3 may be formed in the second area B. FIGS. 12A and 12B illustrate exemplary heat contact placement points in the dummy region of a semiconductor die 9. In particular, heat contacts, e.g., heat conductive plugs 7, may be formed in the dummy region, e.g., an area between adjacent cell blocks 2 or in the scribe line 4. The formation of the heat conductive plugs 7 will be explained further below in conjunction with FIG. 3.

Figure 3:
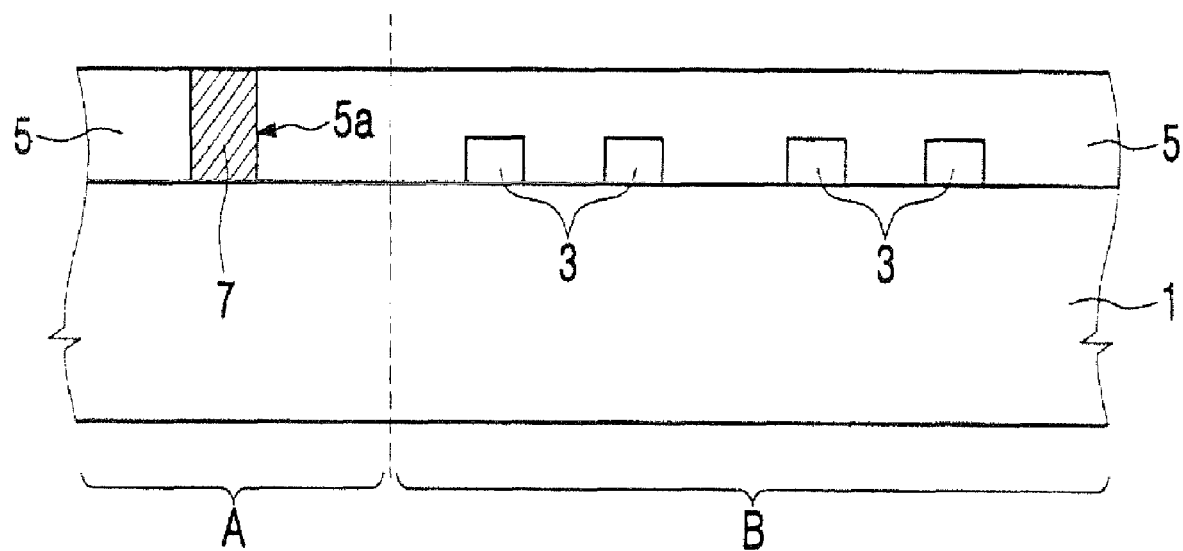

Referring to FIGS. 1 and 3, a contact hole 5a is formed in the insulation layer 5, which exposes a predetermined area of the first semiconductor substrate 1. The contact hole 5a may be formed to expose a region of the first area A of the first semiconductor substrate 1. Then a heat conductive plug 7 may be formed in the contact hole 5a by using a conventional deposition process (step 15 of FIG. 1). The heat conductive plug 7 may comprise a metal film or a semiconductor film that has a higher heat conductivity than that of the insulation layer 5. For example, the heat conductive plug 7 may be formed with a metal film that has a high melting point, greater than 800° C., for example, such as a tungsten film, a platinum film or a polysilicon film. Also, the heat conductive plug 7 may comprise a carbon nanotube (CNT).

Figure 4:
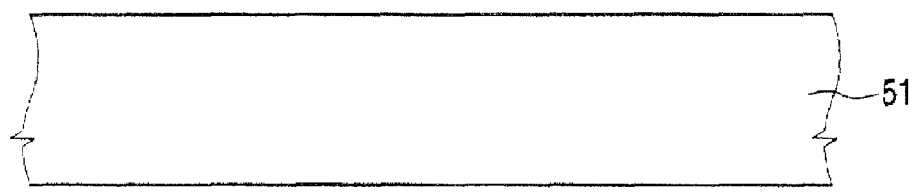
Figure 5:
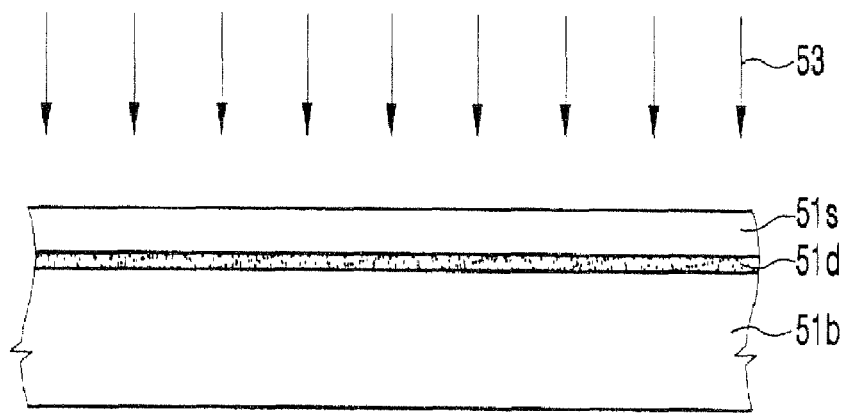

FIG. 4 is a cross-sectional view of a second semiconductor substrate according to some embodiments. FIG. 5 is a cross-sectional view of a second semiconductor substrate following formation of a separation layer according to some embodiments.

Referring to FIGS. 1, 4, and 5, a second semiconductor substrate 51 is provided. The second semiconductor substrate 51 may comprise single crystal silicon or some other single crystalline material, such as GaAs, SOI, $Al_2O_3$, MgO or the like. A damaged layer or separation layer 51d may be formed by injecting impurity ions 53 into the second semiconductor substrate 51. One such method is described in U.S. Pat. No. 6,423,614. The separation layer 51d may be located at a specific depth from the surface of the second semiconductor substrate 51. As a result, the second semiconductor substrate 51 may be separated into a surface layer 51s and bulk layer 51b by the separation layer 51d (step 17 of FIG. 1). The surface layer 51s may be used later to form a body layer of a semiconductor device as described further below.

According to some embodiments, the impurity ions 53 may be hydrogen ions. Other ions may also be used instead of, or in conjunction with, hydrogen ions. Hydrogen ions 53 may be injected with an implantation dose of about $1\times10^{16}$ atoms/$cm^2$ to about $1\times10^{17}$ atoms/$cm^2$. In this case, hydrogen ions weaken the bonding energy among semiconductor atoms in the separation layer 51d. For example, if the second semiconductor substrate 51 is a silicon substrate, hydrogen ions are known to weaken the bonding energy among silicon atoms in the silicon substrate. The thickness of the surface layer 51s may be adjusted according to the ion implantation energy of the impurity ions 53. If the ion implantation energy of the impurity ions 53 is increased, the specific depth of the separation layer 51d will be increased. In turn, the thickness of the surface layer 51s is correspondingly increased. Therefore, one skilled in the art will appreciate that the particular thicknesses of the surface layer 51s that are required for particular semiconductor devices such as non-volatile memories can be adjusted by varying the ion implantation energy of the impurity ions 53. For example, an ion implantation energy of about 40 keV to about 50 keV may be used to form non-volatile memories and an implant energy of about 25 keV to about 30 keV may be used to form SRAM devices.

Figure 6:
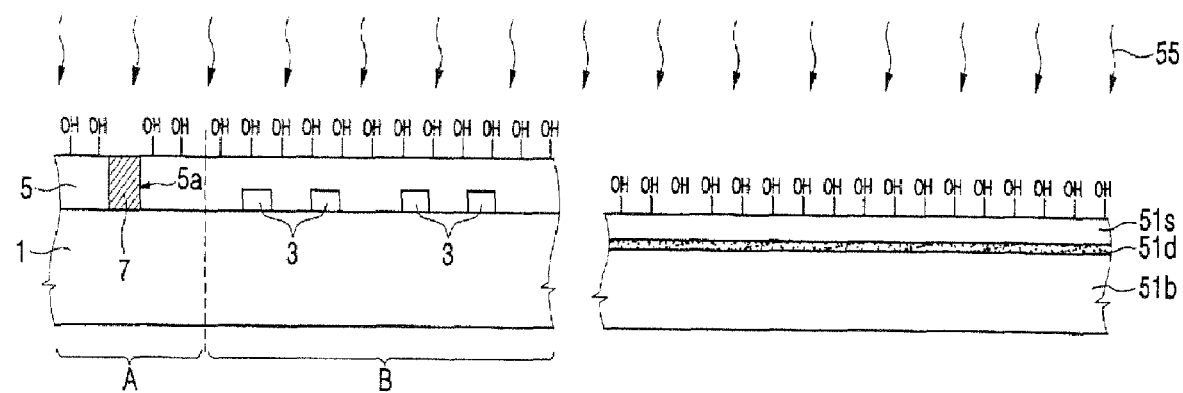

FIG. 6 is a cross-sectional view of a first and second semiconductor substrate following surface treatment according to some embodiments.

Referring to FIGS. 1 and 6, the insulation layer 5 on the first semiconductor substrate 1 and the surface layer 51s on the second semiconductor substrate 51 may be activated by applying a surface treatment process 55 (step 19 of FIG. 1). The activation of the insulation layer 5 and the surface layer 51s is done to improve the adhesive strength of the layers during bonding.

According to some embodiments, the surface treatment process 55 may include a plasma treatment process to increase adhesion strength between the insulation layer 5 and the surface layer during the bonding process to be performed subsequently. The plasma treatment process may use an inert gas or an oxygen gas as a plasma source gas. The inert gas may include nitrogen or argon. The plasma process may provide hydroxyl groups such as "—OH" on the surfaces of the insulation layer 5 and surface layer 51s. These hydroxyl groups convert the surfaces into hydrophilic surfaces.

According to another embodiment, the surface treatment process 55 may be a wet process. The wet process can include a cleaning step to remove particles or contaminants existing on the surfaces of the insulation layer 5 and the surface layer 51s. Then a hydrofluoric acid (HF) solution may be provided to the cleaned surfaces of the insulation layer 5 and the surface layer 51s. The HF solution causes hydroxyl groups such as "—OH" to be formed on the surfaces of the insulation layer 5 and the surface layer 51s, converting the surfaces into hydrophilic surfaces. Accordingly, the surfaces of the insulation layer 5 and the surface layer 51s are activated.

Figure 7:
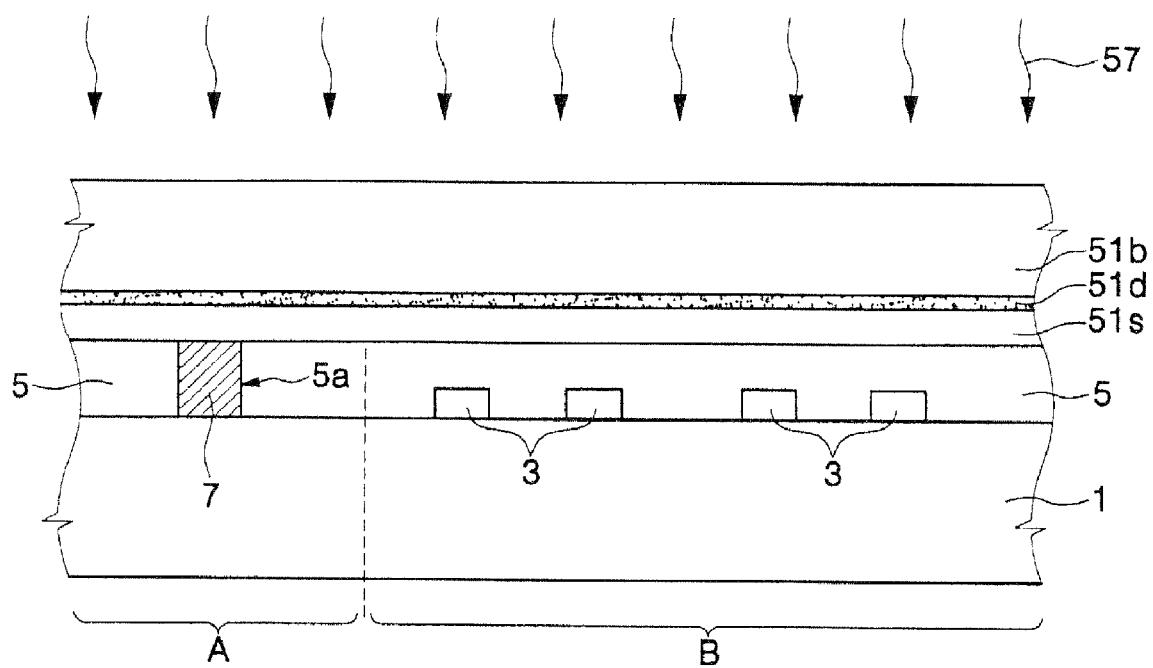

FIG. 7 is a cross-sectional view of a first and second semiconductor substrate following bonding of the substrates according to some embodiments.

Referring to FIGS. 1 and 7, the insulation layer 5 is bonded with the surface layer 51s having the lower discrete devices 3 and the heat conductive plug 7 formed therein (step 21 of FIG. 1). Therefore, the insulation layer 5 and the heat conductive plug 7 exposed through the insulation layer 5 are in direct contact with the surface layer 51s before the surface layer 51s is separated from the bulk layer 51b at the separation layer 51d as will be explained later.

The bonding process may include a heat treatment process, indicated by an arrow 57 in FIG. 7, performed at a first temperature of about 100° C. to about 600° C. for a period of about one (1) minute to about four (4) hours. More preferably, the heat treatment process may be performed at a temperature range of about 400° C. to about 500° C. for about thirty (30) minutes to about two (2) hours. During the bonding process, the activated surfaces of the insulation layer 5 and the surface layer 51s may be first aligned and then brought into contact. As discussed above, the hydroxyl groups on the surfaces react together to increase the adhesive strength between the surfaces. Water ($H_2O$) may be produced by the reaction of hydroxyl groups and may be evaporated into the atmosphere during the bonding process. Pressure may be applied during the bonding process to improve the bonding between the insulation layer 5 and the surface layer 51s.

Figure 8:
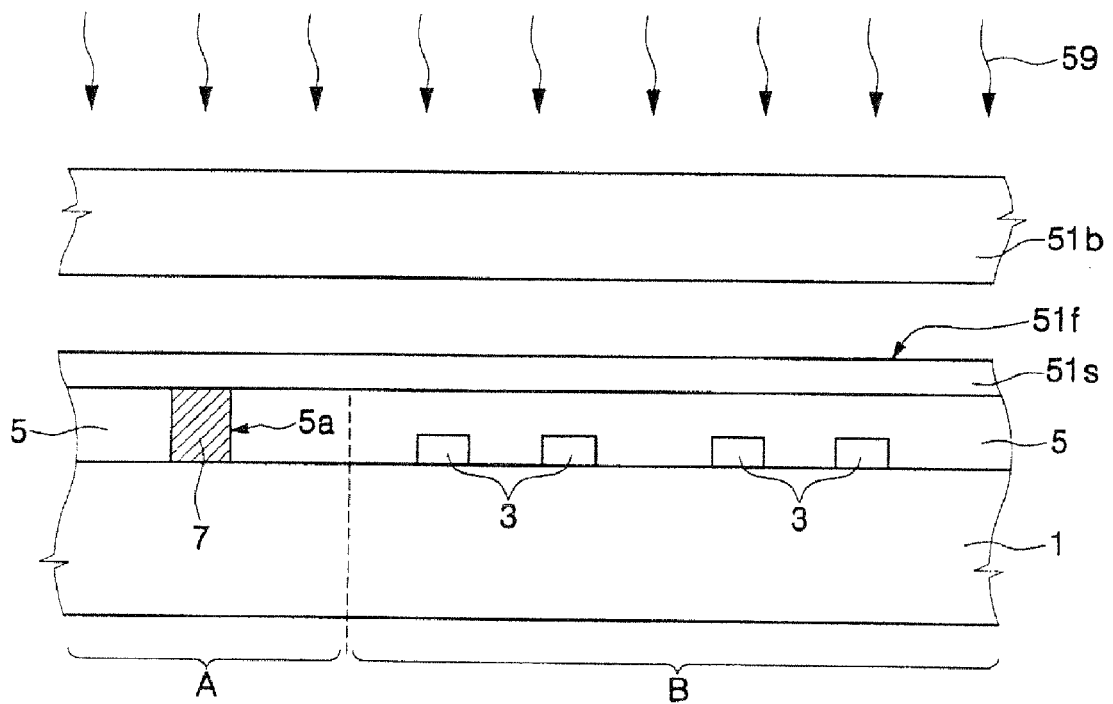

FIG. 8 is a cross-sectional view of a first and second semiconductor substrate following delamination according to some embodiments.

Referring to FIGS. 1 and 8, after bonding the insulation layer 5 to the surface layer 51s, the substrate 51b is heated at a second temperature of about 200° C. to about 900° C. for about five (5) minutes to about four (4) hours. Preferably, the substrate 51b is heated at 600-700° C. for about thirty (30) minutes to about one (1) hour. The heat treatment 59 causes the bulk layer 51b to delaminate from the surface layer 51s at the separation layer 51d (step 23 of FIG. 1). The delamination process exposes the surface 51f of the surface layer 51s. The second temperature of the delamination process may be higher than the first temperature of the bonding process. The heat treatment process 59 may be performed in an air and/or nitrogen gas atmosphere. During the heat treatment process 59, as is known in the art, hydrogen ions react with each other and the semiconductor crystal lattice, causing cracks through the separation layer 51d. As a result, the bulk layer 51b is detached from the surface layer 51s.

Alternatively, the bulk layer 51b may be separated or delaminated from the surface layer 51s at the separation layer 51d by applying a mechanical force to the bulk layer 51b and/or to the surface layer 51s using an apparatus disclosed in, for example, U.S. Pat. Nos. 5,994,207, 6,596,610 and 6,720,640. With this method that can be performed at room temperature without using a furnace, various problems such as contamination of wafers, unnecessary thermal impact on the wafers, and the difficulty of handling wafers within the furnace can be effectively avoided.

After the heat treatment process 59, the exposed surface 51f of the surface layer 51s tends to be rough or shows an uneven profile. Additionally, some of the separation layer 51d may remain on the surface layer 51s, causing crystalline defects in the exposed surface 51f. Therefore, to improve the electrical characteristics of the surface layer 51s, an upper portion of the surface layer 51s along with some of the remaining separation layer 51d may be removed as described below in conjunction with FIG. 9.

Furthermore, some of the impurity ions previously implanted during the ion implantation process may remain in the surface layer 51s following delamination. These impurity ions 53 (see FIG. 5) can deteriorate the electrical characteristics of the surface layer 51s. Therefore, the impurity ions 53 from the surface layer 51s may be removed to improve the electrical characteristics of the semiconductor device.

Figure 9:
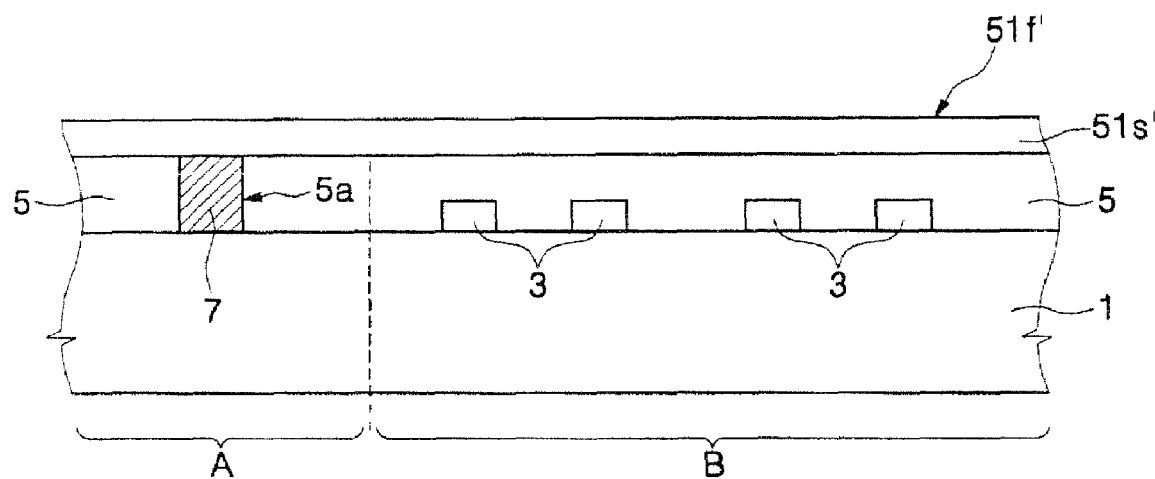

FIG. 9 is a cross-sectional view of a first semiconductor substrate with the surface layer 51s from the second semiconductor substrate 51 following delamination according to some embodiments.

Referring to FIGS. 1 and 9, the surface layer 51s may be exposed to a blanket etch process (step 25a of FIG. 1), creating a flat surface layer 51s' having a flat surface 51f'. The blanket etch process may include a wet etch process, a dry etch process, and/or a CMP process. The remnants of the separation layer 51d existing over the surface layer 51s are removed by the blanket etch process. Accordingly, the whole surface area of the flat surface layer 51s' can have a single-crystal structure. Impurity ions 53 may still remain in the flat surface layer 51s' though.

According to some embodiments of the invention, a sacrificial oxide layer process may be used instead of the blanket etch process. The surface layer 51s may be oxidized by a conventional oxidation process (step 25b of FIG. 1) such as thermal oxidation to form a sacrificial oxide layer (not illustrated). The sacrificial oxide layer may then be removed by conventional techniques such as wet etching creating the flat surface layer 51s' having the flat surface 51f' (step 27b of FIG. 1).

Figure 10:
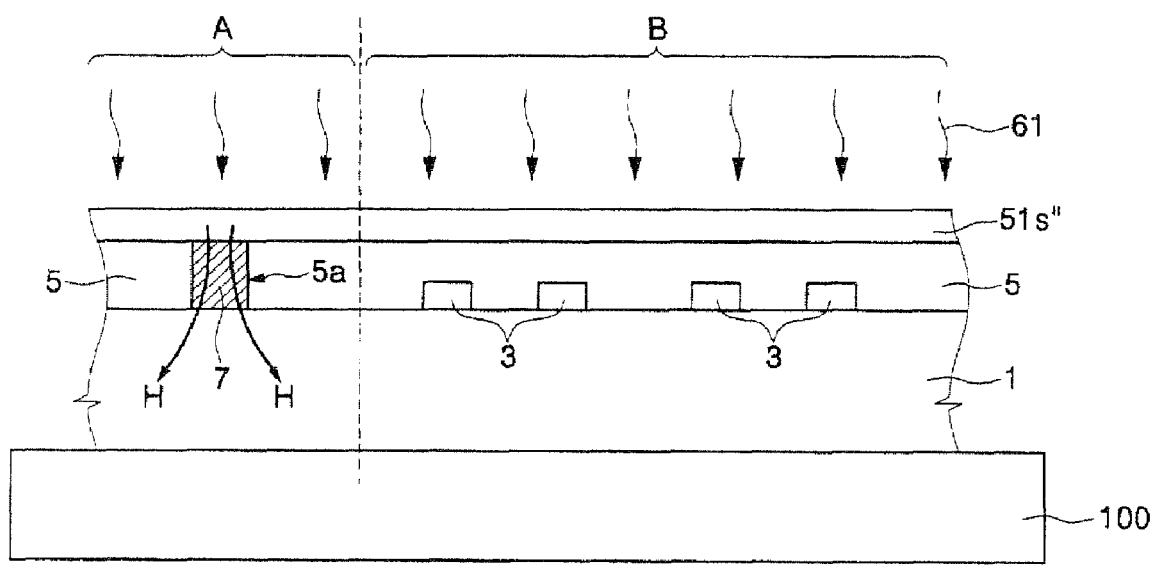

FIG. 10 is a cross-sectional view of a first semiconductor substrate illustrating the heat treatment process of the surface layer according to some embodiments.

Referring to FIGS. 1 and 10, the flat surface layer 51s' may be loaded onto a cooling stage or heat sink 100. The cooling stage 100 may include a circulation conduit (not shown) having a cooling medium circulating within. The cooling medium may be, for example, water. Therefore, when the cooling medium passes through the circulation conduit, the cooling stage 100 may be cooled. Alternatively, any cooling stage, with or without cooling medium, which can create a temperature gradient between the semiconductor substrate or the wafer placed thereon and the cooling stage may be used within the spirit and the scope of the present invention.

A high-temperature heat treatment process 61 may be applied to the flat surface layer 51s'. Among other things, the heat treatment process 61 may cause impurity ions 53 to be removed from the flat surface layer 51s' (step 27a of FIG. 1). Also, crystal defects remaining in the flat surface layer 51s' from the delamination process may be removed or cured during the heat treatment process 61. The heat treatment process 61 may be performed at a third temperature of about 600° C. to about 1200° C., for about ten (10) seconds to about five (5) minutes in the case of using RTP or about five (5) minutes to about four (4) hours in the case of using a furnace. As a result, the flat surface layer 51s' may be converted into a single crystal semiconductor layer 51s'' having substantially no impurity ions but having a cured surface layer. The heat treatment process 61 may be performed in a nitrogen gas, hydrogen gas or oxygen gas atmosphere, for example.

According to some other embodiments, the heat treatment process 61 may be omitted before a thin film transistor using the cured surface layer is formed when the sacrificial oxidation process is used. This is permissible because impurity ions 53 may be removed along with the sacrificial oxide layer if the sacrificial oxide process is performed at a third temperature of, for example, about 500° C. to about 1000° C., for a time period of about thirty (30) minutes to about four (4) hours.

Therefore, in sum, as illustrated in FIG. 1, the surface layer 51s may be subjected to a blanket etch step (step 25a of FIG. 1) and a subsequent heat treatment step (step 27a). Alternatively, the surface layer 51s may be oxidized to form a sacrificial oxide (step 25b) followed by a subsequent removal of the sacrificial oxide (step 27b). In this case, a subsequent heat treatment step similar to the heat treatment process 61 may or may not be performed.

The heat treatment process indicated by arrow 61 may be different from the heat treatment processes indicated by arrows 57, 59 shown in FIGS. 7 and 8, respectively. Specifically, the heat treatment process 61 may selectively heat the flat surface layer 51s' whereas the bonding and delamination heat steps (57 and 59, respectively) may be performed in a furnace, increasing the temperature of the atmosphere surrounding the semiconductor substrate 1 and the surface layer 51s'. In contrast, the heat treatment process 61 may selectively apply heat to the flat surface layer 51s' by using a halogen lamp or laser. With the use of a laser, heat may not be accumulated in the flat surface layer 51s'.

Without novel features illustrated in the present invention, e.g., heat conductive plugs 7, heat generated during the high-temperature heat treatment process may be inadvertently delivered to the lower discrete devices 3 through the insulation layer 5, particularly if the flat surface layer 51s' is heated. In this case, bulk transistors or lower discrete devices 3 can become deteriorated from the heat, resulting in poor electrical characteristics of the resulting semiconductor devices. However, according to some embodiments of the present invention, the flat surface layer 51s' is physically and thermally coupled to the first semiconductor substrate 1 by the heat conductive plug 7. As described above, in addition, the first semiconductor substrate 1 may be in contact with a cooling stage 100 or other heat sink. Therefore, the heat from the flat surface layer (51s') can be conducted or delivered to the first semiconductor substrate 1 going primarily through, i.e., "channeling through" heat conductive plugs 7 instead of the heat going through the insulation layer 5 during the heat treatment process 61 as indicated by the arrows H in FIG. 10. This is because the heat conductivity of the heat conductive plugs 7 is higher than that of the insulation layer 5.

According to one aspect, the first semiconductor substrate 1 and the cooling stage 100 act as a heat sink to keep heat away from the lower discrete devices 3. Accordingly, deterioration of the lower discrete devices 3 can be prevented even if the heat treatment process 61 is performed. Even if some amount of the heat may be conducted to the lower discrete devices 3, most of the heat is channeled through the heat conductive plugs 7 so the lower discrete devices 3 can be protected from degradation. The heat transmission efficiency of the heat conductive plugs 7 is improved when the cooling stage 100 is operated in conjunction with the heat treatment process, further protecting the lower discrete devices 3.

According to some embodiments, the heat treating and the heat sinking collectively produce a controlled temperature gradient through the insulation layer 5 and the semiconductor substrate 1, the temperature gradient being impacted by the heat-channeling effect of the heat conductive plug 7 away from the lower discrete devices 3.

Figure 11:
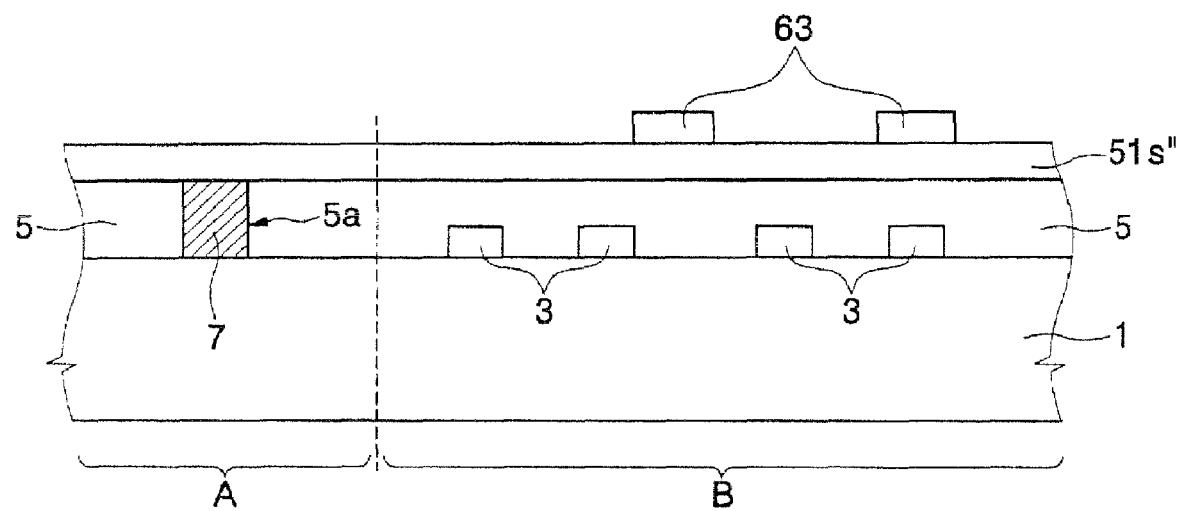

FIG. 11 is a cross-sectional view of a semiconductor device including upper and lower devices according to some embodiments.

Referring to FIGS. 1 and 11, upper discrete devices 63 may be formed on the cured surface layer 51s''. The upper discrete devices 63 may be electrically coupled to other circuit areas such as a peripheral circuit area to form a three-dimensional semiconductor device. As described above, the cured surface layer 51s''' may be a single crystal semiconductor material substantially free from impurities. The upper discrete devices 63 may be formed using the cured surface layer 51s'' as a body layer (step 29 of FIG. 1). The upper discrete devices may have improved electrical characteristics because of the single-crystalline nature of the cured surface layer 51s'''.

According to some embodiments, the upper discrete devices 63 may be thin film transistors (TFTs).

In accordance with the described method, a three-dimensional semiconductor device is manufactured using a minimum number of bonding and delamination steps compared to the prior art methods. Further, the upper discrete devices of the three-dimensional semiconductor structure have improved electrical characteristics owing to the single-crystalline nature of the upper body layer.

Embodiments of the invention may be practiced in many ways. What follows are exemplary, non-limiting descriptions of some embodiments.

A three-dimensional semiconductor device having improved electrical characteristics may be fabricated according to an embodiment. The three-dimensional semiconductor device may include a semiconductor substrate having a first area and a second area. The second area may correspond to an active area and a field area defining the active area. The second area may include cell or peripheral circuit areas. The first area may correspond to an area other than the second area. The first area may be a dummy area such as a scribe line area. The second area of the semiconductor substrate may have lower discrete devices disposed thereon. The lower discrete devices may include, but are not limited to, bulk transistors, capacitors, diodes, and/or resistors. The bulk transistors may be metal-oxide-semiconductor (MOS) transistors and/or bipolar transistors that are formed using the semiconductor substrate as a body layer.

The lower discrete devices and the semiconductor substrate are covered with an insulation layer. The insulation layer may substantially completely cover the lower discrete devices. A conductive heat plug may penetrate the insulation layer, contacting the semiconductor substrate. The heat conductive plug may contact the semiconductor substrate in the first area. Also, the heat conductive plug may have a higher heat conductivity than that of the insulation layer. For example, the heat conductive plug may be a refractory metal plug with a high melting point such as a tungsten plug or a platinum plug. According to some embodiments, the heat conductive plug may be a semiconductor plug such as a silicon plug.

A single crystal semiconductor layer may be stacked over the insulation layer. The single crystal semiconductor layer may contact a top surface of the heat conductive plug. An upper discrete device may be formed on the single crystal semiconductor layer. The upper discrete device may be a TFT. The TFT may be an MOS transistor or a bipolar transistor that is fabricated using the single crystal semiconductor layer as a body layer. The thin film transistor may have improved electrical characteristics due to the single-crystalline nature of the body layer.

According to some embodiments, an insulation layer may be formed over a semiconductor substrate having lower discrete devices. Heat conductive plugs may be formed in the insulation layer contacting the semiconductor substrate having the lower discrete devices. High-temperature heat treatment processes may be used to optimize electrical characteristics of a single crystal semiconductor layer on the insulation layer by removing impurity ions or curing crystal defects. The heat generated from the high-temperature heat treatment processes may be effectively channeled away from the lower discrete devices, into the semiconductor substrate without degrading the lower discrete devices. The semiconductor substrate may be in contact with a cooling stage or other heat sink to remove the heat from the semiconductor substrate. Accordingly, even if a heat treatment process at a high temperature is used to form a single crystal semiconductor layer having substantially no impurity ions but having a cured surface layer on the insulation layer, a substantial amount of the heat generated from the high-temperature heat treatment process can be removed to the semiconductor substrate through heat conductive plugs. As a result, the deterioration of the lower discrete devices can be prevented even if a high-temperature heat treatment process is performed to form a three-dimensional semiconductor device disclosed herein.

Reference throughout this specification to "some embodiments" or "an embodiment" means that a particular feature, structure, or characteristic described in connection with the embodiment is included in at least one embodiment of the present invention. Thus, the appearances of the phrases "some embodiment" or "an embodiment" in various places throughout this specification are not necessarily all referring to the same embodiment. Furthermore, the particular features, structures, or characteristics may be combined in any suitable manner in one or more embodiments.

Although various preferred embodiments have been disclosed herein for illustrative purposes, those skilled in the art will appreciate that various modifications, additions, and substitutions are possible without departing from the scope and spirit of the invention as provided in the accompanying claims. For example, various operations have been described as multiple discrete steps performed in a manner that is most helpful in understanding the invention. However, the order in which the steps are described does not imply that the operations are order-dependent or that the order that steps are performed must be the order in which the steps are presented.

The invention claimed is:

1. A method of manufacturing a semiconductor device comprising:
    forming an insulation layer on a first semiconductor substrate;
    forming an opening through the insulation layer, the opening exposing a region of the first semiconductor substrate;
    forming a heat conductive plug in the opening;
    forming a separation layer in a second semiconductor substrate, the separation layer separating a surface layer and a bulk layer on the second semiconductor substrate;
    bonding the insulation layer of the first substrate to the surface layer of the second substrate;
    delaminating the bulk layer from the surface layer at the separation layer;
    heat treating the surface layer while conducting heat away from the surface layer primarily through the heat conductive plug into the first semiconductor substrate; and
    forming an upper device on the surface layer.

2. The method of claim 1, wherein the heat conductive plug has a higher heat conductivity than the insulation layer.

3. The method of claim 1, wherein forming the insulation layer on the first semiconductor substrate comprises:
    forming a lower discrete device on the first semiconductor substrate; and
    forming the insulation layer on the first semiconductor substrate substantially covering the lower device.

4. The method of claim 3, wherein forming a lower discrete device comprises forming a bulk transistor.

5. The method of claim 1, wherein forming the separation layer comprises implantation of impurity ions into the first semiconductor substrate.

6. The method of claim 5, wherein the impurity ions are hydrogen ions.

7. The method of claim 6, wherein the hydrogen ions are implanted with a dose of about $1 \times 10^{16}$ atoms/cm$^2$ to about $1 \times 10^{17}$ atoms/cm$^2$.

8. The method of claim 1, further comprising creating a hydrophilic surface on the insulation layer and the surface layer.

9. The method of claim 8, wherein creating a hydrophilic surface comprises exposing the insulation layer and the surface layer to a plasma including a plasma source gas.

10. The method of claim 9, wherein the plasma source gas is oxygen gas.

11. The method of claim 8, wherein creating a hydrophilic surface comprises:
    cleaning the insulation layer and the surface layer using a wet process; and
    exposing the insulation layer and the surface layer to hydrofluoric acid.

12. The method of claim 1, wherein bonding the insulation layer to the surface layer comprises:
    placing the insulation layer in contact with the surface layer; and
    heating the insulation layer and surface layer at a temperature of about 100° C. to about 600° C.

13. The method of claim 1, wherein delaminating the bulk layer from the surface layer comprises:
    heating the separation layer at a temperature of about 200° C. to about 900° C.; and
    removing the separation layer and the bulk layer from the surface layer.

14. The method of claim 13, wherein heating the separation layer is performed in a nitrogen environment.

15. The method of claim 1, wherein heat treating the surface layer is performed at a temperature of about 600° C. to about 1200° C.

16. The method of claim 1, further comprising, after delaminating:
blanket etching the surface layer.

17. The method of claim 16, wherein etching the surface layer comprises a wet etch process, a dry etch process, or a chemical-mechanical polishing (CMP) process.

18. The method of claim 15, further comprising cooling the first semiconductor substrate while heat treating.

19. The method of claim 18, wherein cooling comprises placing the first semiconductor substrate in contact with a heat sink.

20. The method of claim 19, wherein the heat sink comprises a cooling stage having a coolant medium.

21. The method of claim 15, wherein heat treating the surface layer is performed in an environment comprising nitrogen gas, hydrogen gas, or oxygen gas.

22. The method of claim 15, wherein heat treating the surface layer comprises placing the surface layer in a furnace, exposing the surface layer with a halogen lamp, or exposing the surface layer with a laser.

23. The method of claim 1, further comprising, after delaminating:
forming a sacrificial oxide layer on the surface layer; and
removing the sacrificial oxide layer.

24. The method of claim 23, wherein forming a sacrificial oxide layer is performed at a temperature range of about 500° C. to 1000° C. for a time period of about thirty (30) minutes to four (4) hours.

25. A method of manufacturing a semiconductor device, the method comprising:
forming a lower device in a first region of a first semiconductor substrate;
forming an insulation layer on the first semiconductor substrate, the insulation layer having the lower device therein;
forming an opening through the insulation layer, exposing a second region of the first semiconductor substrate;
forming a heat conductive plug in the opening, the heat conductive plug having a higher heat conductivity than the insulation layer;
forming a separation layer in a second semiconductor substrate, wherein the separation layer separates a surface layer and a bulk layer on the second semiconductor substrate and the surface layer comprises a single-crystalline material;
performing a surface treatment on the insulation layer and the surface layer, wherein the surface treatment creates a hydrophilic surface on the insulation layer and the surface layer;
bonding the insulation layer to the surface layer;
delaminating the bulk layer from the surface layer at the separation layer;
heat treating the surface layer to remove any artifacts of the forming of and delaminating at the separation layer from the surface layer, wherein heat treating comprises:
placing the first semiconductor substrate on a cooling stage; and
applying heat to the surface layer thereby channeling heat away from the surface layer through the heat conductive plug into the first semiconductor substrate toward the cooling stage; and
then, forming an upper device on the surface layer.

26. The method of claim 25, wherein the second region of the first semiconductor substrate comprises a scribe line area.

* * * * *

UNITED STATES PATENT AND TRADEMARK OFFICE
CERTIFICATE OF CORRECTION

PATENT NO. : 7,605,022 B2
APPLICATION NO. : 11/621513
DATED : October 20, 2009
INVENTOR(S) : Yong-Won Cha et al.

It is certified that error appears in the above-identified patent and that said Letters Patent is hereby corrected as shown below:

Column 1, line 31, the word "semi-conductor" should read -- semiconductor --;
Column 7, line 19, the word "fiat" should read -- flat --.

Signed and Sealed this

Fifth Day of January, 2010

David J. Kappos
*Director of the United States Patent and Trademark Office*